(12) United States Patent
Hoentschel et al.

(10) Patent No.: US 8,030,148 B2
(45) Date of Patent: Oct. 4, 2011

(54) STRUCTURED STRAINED SUBSTRATE FOR FORMING STRAINED TRANSISTORS WITH REDUCED THICKNESS OF ACTIVE LAYER

(75) Inventors: Jan Hoentschel, Dresden (DE); Andy Wei, Dresden (DE); Sven Beyer, Fishkill, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 94 days.

(21) Appl. No.: 12/507,854

(22) Filed: Jul. 23, 2009

(65) Prior Publication Data
US 2010/0055867 A1 Mar. 4, 2010

(30) Foreign Application Priority Data
Aug. 29, 2008 (DE) .......................... 10 2008 044 983

(51) Int. Cl.
*H01L 21/338* (2006.01)
*H01L 21/8234* (2006.01)
(52) U.S. Cl. . 438/198; 438/419; 438/405; 257/E21.546; 257/E21.115
(58) Field of Classification Search .................. 438/419, 438/405, 198; 257/E21.115, E21.119, E21.546
See application file for complete search history.

(56) References Cited

U.S. PATENT DOCUMENTS

| | | | |
|---|---|---|---|
| 6,764,908 B1 * | 7/2004 | Kadosh et al. ................ | 438/285 |
| 7,528,078 B2 * | 5/2009 | Van Gompel et al. ........ | 438/792 |
| 2004/0150042 A1 | 8/2004 | Yeo et al. ....................... | 257/347 |
| 2005/0095807 A1 | 5/2005 | Xiang ............................ | 438/424 |
| 2005/0205859 A1* | 9/2005 | Currie et al. .................... | 257/19 |
| 2005/0260810 A1* | 11/2005 | Cheng et al. ................... | 438/199 |
| 2006/0284252 A1 | 12/2006 | Boussagol et al. ............ | 257/347 |
| 2008/0213962 A1* | 9/2008 | Clifton .......................... | 438/285 |

OTHER PUBLICATIONS

Lei et al., "Strain relaxation in patterned strained silicon directly on insulator structures," *Applied Physics Letters*, 87:251926-1-3, 2005.
PCT Search Report from PCT/EP2009/006261 dated Mar. 4, 2010.
PCT Preliminary Report on Patentability from PCT/EP2009/006261 dated Nov. 10, 2010.

* cited by examiner

*Primary Examiner* — Caridad Everhart
(74) *Attorney, Agent, or Firm* — Williams, Morgan & Amerson, P.C.

(57) ABSTRACT

In a strained SOI semiconductor layer, the stress relaxation which may typically occur during the patterning of trench isolation structures may be reduced by selecting an appropriate reduced target height of the active regions, thereby enabling the formation of transistor elements on the active region of reduced height, which may still include a significant amount of the initial strain component. The active regions of reduced height may be advantageously used for forming fully depleted field effect transistors.

24 Claims, 7 Drawing Sheets

STRUCTURED STRAINED SUBSTRATE FOR FORMING STRAINED TRANSISTORS WITH REDUCED THICKNESS OF ACTIVE LAYER

BACKGROUND OF THE INVENTION

1. Field of the Invention

Generally, the present disclosure relates to the field of integrated circuits, and, more particularly, to the manufacture of transistors having strained channel regions by using stress-inducing sources, such as globally strained silicon substrates and the like, to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is presently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode located close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region is a dominant factor determining the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. For instance, the thickness of the gate insulation layer, typically an oxide-based dielectric, has to be reduced with reducing the gate length, wherein a reduced thickness of the gate dielectric may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has therefore been proposed to also enhance the channel conductivity of the transistor elements by increasing the charge carrier mobility in the channel region for a given channel length, thereby offering the potential for achieving a performance improvement that is comparable with the advance to technology nodes using reduced gate lengths, while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating uniaxial tensile strain in the channel region along the channel length direction for a standard crystallographic orientation increases the mobility of electrons, which in turn may directly translate into a corresponding increase in the conductivity. On the other hand, uniaxial compressive strain in the channel region for the same configuration as above may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semi-conductor material, which may enable the fabrication of fast powerful semiconductor devices without requiring expensive semiconductor materials, while many of the well-established manufacturing techniques may still be used.

In some approaches, external stress created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may significantly contribute to the overall production costs. Moreover, the amount of stress-inducing material and in particular the intrinsic stress thereof may not be arbitrarily increased without requiring significant design alterations. For example, the degree of tensile stress in corresponding portions of the dielectric layer formed above an N-channel transistor may presently be limited to approximately 1.5 GPa (Giga Pascale), while the amount of tensile stressed material may have to be reduced in sophisticated transistor geometries including reduced distances of neighboring transistor elements in device areas of high packing density, and thus new developments of respective deposition techniques may be required for further improving performance of N-channel transistors on the basis of stressed overlayers. On the other hand, significantly higher compressive stress levels may be provided for P-channel transistors by presently established techniques, thereby creating an imbalance with respect to enhancing performance of NMOS and PMOS transistors.

In still a further approach, a substantially amorphized region may be formed adjacent to the gate electrode at an intermediate manufacturing stage, which may then be re-crystallized in the presence of a rigid layer formed above the transistor area. During the anneal process for re-crystallizing the lattice, the growth of the crystal will occur under stress conditions created by the overlayer and result in a tensile strained crystal. After the re-crystallization, the sacrificial stress layer may be removed, wherein, nevertheless, a certain amount of strain may be "conserved" in the re-grown lattice portion. This effect is generally known as stress memorization. Although this mechanism provides a promising technique for enhancing performance of N-channel transistors, a highly controlled application thereof is difficult as the exact mechanism is not yet understood.

In other approaches, a strain-inducing semiconductor alloy may be provided within drain and source regions, which may exert a specified type of stress on the channel region to thereby induce a desired type of strain therein. For example, a silicon/germanium alloy may frequently be used for this purpose in order to obtain a compressive stress component in the adjacent channel region of, for instance, P-channel transistors in order to increase mobility of holes in the corresponding P-channel. In sophisticated applications, two or more of the above-specified strain-inducing mechanisms may be combined to further enhance the overall strain obtained in the corresponding channel regions. However, these strain-inducing mechanisms may be considered as "local" mechanisms, since the strain may be induced in and above the corresponding active region for the transistor element under consideration, wherein the finally obtained strain component in the channel region may significantly depend on the overall device dimensions. That is, typically, these local strain-inducing mechanisms may rely on the stress transfer capabilities via other device components, such as gate electrodes, spacer elements formed on sidewalls of the gate electrodes, the lateral dimensions of the drain and source regions and the like. Consequently, the magnitude of the strain in the channel region may significantly depend on the technology under consideration, since, typically, reduced device dimensions may result in an over-proportional reduction of the corresponding strain-inducing mechanism. For example, creating strain by a dielectric overlayer, such as a contact etch stop layer, may frequently be used wherein, however, the amount of internal stress of the corresponding dielectric material may be restricted by deposition-related constraints, while at the same time, upon reducing device dimensions, for instance the spacing between two neighboring transistor elements, may require a significant reduction of the layer thickness, which may thus result in a reduction of the finally obtained strain component. For these reasons, typically, the magnitude of the strain in the channel region provided by the local strain-inducing mechanisms may be several hundred MPa, while a further increase of this value may be difficult to be achieved upon further device scaling.

For this reason, attention is increasingly drawn to other mechanisms in which a moderately high degree of strain may be created in a global manner, i.e., on wafer level, so that the corresponding active regions of the transistor elements may be formed in a globally strained semiconductor material, thereby providing a "direct" strain component in the corresponding channel regions. For instance, a silicon material may be epitaxially grown on an appropriately designed "buffer layer" in order to obtain a strained silicon layer. For example, a silicon/germanium buffer layer, which may be provided with its substantially natural lattice constant, may be used for forming thereon a strained silicon layer, which may have a moderately high tensile biaxial strain of 1 GPa or higher, depending on the lattice mismatch between the buffer layer and the strained silicon layer. For example, a substantially relaxed silicon/germanium layer having a fraction of approximately 20 atomic percent germanium may result in a tensile biaxial strain of a corresponding epitaxially grown silicon material of 1.3 GPa, which is significantly higher compared to the strain levels obtained by the local strain-inducing mechanisms described above. The creation of a global strained silicon layer may also be efficiently accomplished on the basis of a silicon-on-insulator (SOI) architecture by sophisticated wafer bonding techniques. That is, a strained silicon layer may be formed on the basis of an appropriately designed buffer layer, as explained above, and the corresponding silicon layer may be bonded to a carrier wafer having formed thereon a silicon dioxide layer. After the bonding of the strained silicon layer to the carrier wafer, the strained semiconductor layer may be cleaved, for instance by incorporating an appropriate species, such as hydrogen, helium and the like, wherein the previously generated strain may be substantially maintained due to the adhesion of the strained silicon material on the material of the carrier wafer. Consequently, a globally strained silicon layer may also be provided in applications in which SOI architecture may be required, at least for performance driven transistor elements. Although the provision of a globally strained silicon layer may be considered as a very promising approach for forming highly strained transistor elements, for instance on the basis of an SOI architecture, it appears that the initial high strain component of the silicon layer may be drastically reduced, in particular for highly scaled transistor dimensions. In particular, the provision of trench isolation structures may represent a significant contributor to a reduction of the global strain component in the silicon layer, thereby making the approach of a global strained silicon layer a less attractive approach for sophisticated applications.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for providing sophisticated semiconductor substrates and for forming respective transistor elements thereon, wherein an efficient strain-inducing mechanism may be established by providing a moderately high global strain component in the semiconductor material after fabrication of trench isolation structures, thereby allowing further device scaling on the basis of globally strained semiconductor materials with enhanced flexibility in adapting the magnitude of the strain in the semiconductor layer to the specifics of the patterning regime for forming the corresponding trench isolation structures. It has been recognized that a strong correlation exists between the initial thickness of the strained semiconductor material and the lateral dimensions of the active regions defined by the trench isolation structure. The degree of strain relaxation may significantly increase when reducing the lateral dimensions of the active region for a given moderately great value of the thickness of the strained semiconductor layer. Consequently, upon further device scaling, which may correspond to the reduction of the lateral dimensions of the active regions, a corresponding reduction of the available strain component in the active region and thus in the channel regions may be observed. On the other hand, reducing the thickness of the strained semiconductor material may result in a less pronounced reduction of the global strain component upon further device scaling or may even result in a substantially constant strain component irrespective of the lateral dimensions of the active regions. For this reason, the present disclosure provides techniques in which the layer thickness of the strained semiconductor material may be appropriately adapted to the specifics of the patterning process for forming trench isolation structures, thereby enabling an efficient overall process flow for forming sophisticated transistor elements on the basis of moderately thin semiconductor layers for a given initial layer thickness. Thus, the same type of initially strained semiconductor wafers may be used while nevertheless enabling moderately high strain components by appropriately taking into consideration the effects of the patterning of the initial strained semiconductor material, for instance during the formation of isolation trenches.

One illustrative method disclosed herein comprises providing a silicon-containing semiconductor layer above a substrate, wherein the silicon-containing semiconductor layer has an internal biaxial strain. The method further comprises forming isolation trenches in the silicon-containing semiconductor layer and reducing a thickness of the silicon-containing semiconductor layer. Additionally, the isolation trenches are filled with an insulating material.

A further illustrative method disclosed herein comprises defining an active region in a strained silicon-containing layer by forming an isolation trench therein. The method additionally comprises removing material of reduced strain of the active region after forming the isolation trench. Finally, the method comprises forming a transistor in and above the active region.

A still further illustrative method disclosed herein relates to the manufacturing of a substrate for forming strained transistor devices therein. The method comprises providing a substrate comprising a semiconductor layer having a biaxial strain, wherein the semiconductor layer has an initial thickness. Additionally, the method comprises reducing the initial thickness at least in a portion of the semiconductor layer so as to adjust a strain level with respect to a strain relaxing effect caused by processing the semiconductor layer so as to form trench isolation structures for providing a plurality of active regions.

BRIEF DESCRIPTION OF THE DRAWINGS

The disclosure may be understood by reference to the following description taken in conjunction with the accompanying drawings, in which like reference numerals identify like elements, and in which.

Figure 1A:
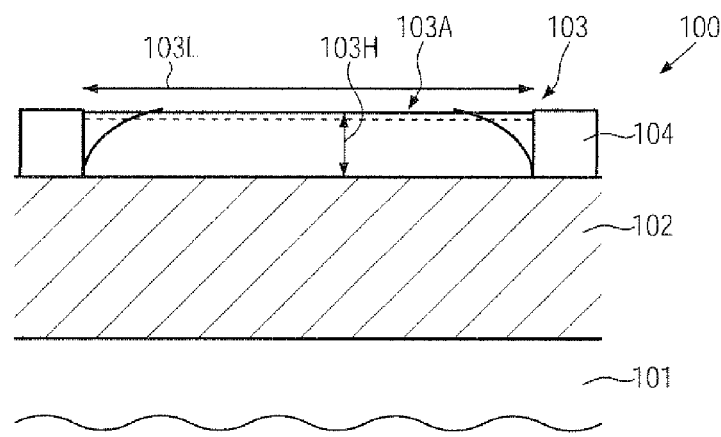
FIG. 1a schematically illustrates a cross-sectional view of a substrate for forming sophisticated transistor elements on the basis of an SOI architecture, wherein the initial strain of a semiconductor layer may be reduced upon providing a shallow trench isolation for defining an active region.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques for forming sophisticated transistor elements on the basis of a globally strained semiconductor material, for instance, provided on a buried insulating layer, wherein a moderately high fraction of the initial strain component may be preserved during the various process steps, such as the formation of shallow trench isolation structures, by appropriately adapting the thickness of the semiconductor material in at least a portion of the active regions of the transistor devices. For this purpose, a specified portion of the globally strained semiconductor material may be removed, for instance, prior to or after patterning corresponding isolation trenches, so that a corresponding strain relaxation in the upper portion of the initially strained semiconductor material may be "compensated" for, thereby maintaining at least a significant fraction of the initial strain component. The corresponding removal of semiconductor material of reduced strain level may be specifically adapted to device and process requirements, for instance, in view of concurrently adjusting a thickness of the active region for sophisticated transistors, such as fully depleted field effect transistors, which may require a thickness of the remaining active semiconductor material of several nanometers. In other cases, the desired basic strain component in the active regions may be adjusted by providing different heights, thereby providing an efficient technique for adjusting overall performance of corresponding transistor elements. The corresponding removal of relaxed semiconductor material may be established on the basis of well-controllable processes, such as oxidation, with subsequent highly selective etch techniques, thereby enabling a sensitive adaptation of the thickness of the active regions and thus of the finally preserved global strain component on the basis of a given initial configuration of the globally strained substrate material. Consequently, the present disclosure provides a high degree of scalability of strain-inducing mechanisms that are based on a globally strained semiconductor material, such as an SOI layer, which may have been formed on the basis of an appropriately adapted buffer material, such as silicon/germanium, silicon/germanium/tin, silicon/carbon and the like, so as to appropriately adjust the initial type and magnitude of strain.

FIG. 1a schematically illustrates a substrate 100 which is to be used for the formation of advanced transistor elements, such as SOI transistors, on the basis of active regions defined by a trench isolation structure. For this purpose, the substrate 100 may comprise a carrier material 101, which may represent any appropriate material for forming thereabove a semiconductor layer 103, such as a silicon layer and the like. For example, the carrier material 101 may represent a semiconductor material, such as a silicon material, as may frequently be used in an SOI configuration. Moreover, the substrate 100 may comprise an insulating layer 102, which may also be referred to as a buried insulating layer and which may frequently be provided in the form of a silicon dioxide material. It should be appreciated, however, that the insulating layer 102 may comprise other dielectric materials, such as silicon nitride, silicon oxynitride and the like. Moreover, the substrate 100 may comprise an isolation structure 104, which may be formed in the semiconductor layer 103 so as to define a corresponding active region 103A which may be understood as a region in and above which transistor elements may be formed if the substrate 100 is used for producing semiconductor devices, such as integrated circuits requiring advanced transistor elements. As previously explained, the active region 103A may exhibit a specific type of strain, which may vary locally in the lateral and/or vertical direction within the active region 103A, depending on the lateral dimensions of the active region 103A. For example, the lateral direction, indicated as 103L, may be referred to as length of the active region 103A, while the vertical extension 103H may be referred to as height of the active region 103A. The lateral dimension 103L may be substantially determined by the overall design rules for a semiconductor device to be formed on the basis of the substrate 100, as explained above. On the other hand, the height 103H may be substantially determined by other constraints, such as the capabilities of a corresponding manufacturing process for forming a globally strained semiconductor layer, such as the layer 103, which may typically be accomplished by a process technique as described above, which may be performed in specifically designed facilities from which the corresponding substrates may be provided as a "raw material" to semiconductor facilities in which the further processing may be continued, for instance, by forming the shallow trench isolations 104 in accordance with overall device requirements. Consequently, a flexible adaptation of the initial height 103H of the semiconductor layer 103 may be difficult to be achieved, in particular for rapidly varying demands in the fabrication of sophisticated semiconductor devices.

During the processing of the substrate 100, well-established process techniques may typically be applied to form isolation trenches and filling the same with an appropriate insulating material, such as silicon dioxide, silicon nitride and the like, thereby providing the trench isolation structure 104. The design rules for the active region 103A may require a certain length 103L, which may result in a corresponding degree of strain relaxation, which may even vary laterally and vertically within the active region 103A. That is, after etching corresponding isolation trenches, a significant strain relaxation may be observed at surface areas of the active region 103A and at sidewalls of the active region 103A, wherein the degree and vertical extension of the corresponding strain relaxation effect may depend on the length 103L for a given initial height 103H.

Figure 1B:
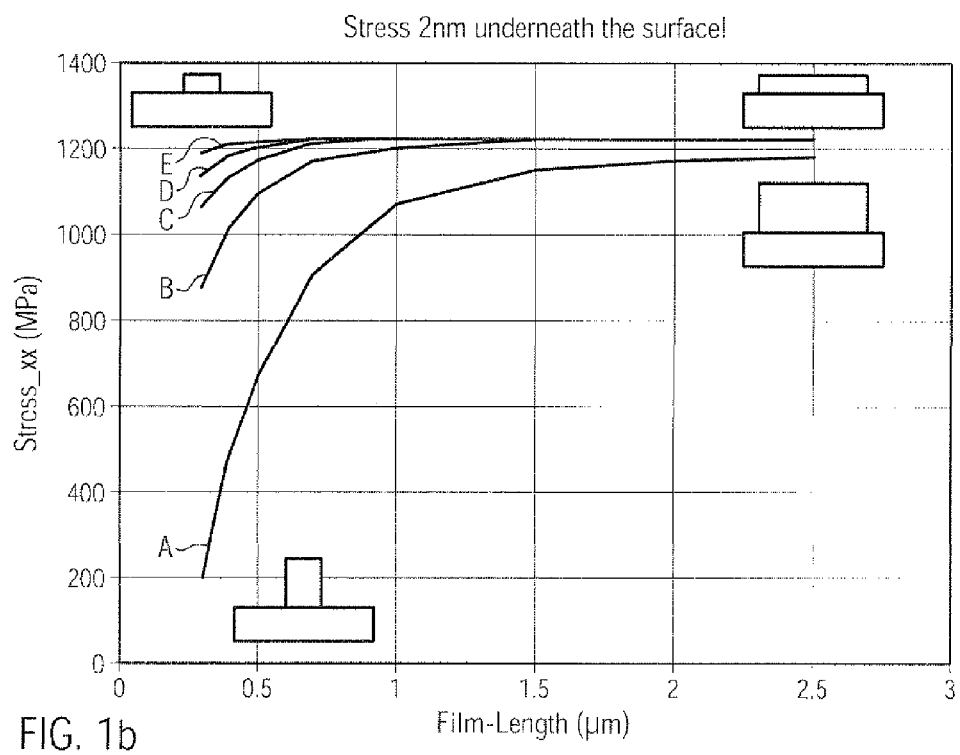
FIG. 1b schematically illustrates a graph representing the correlation between lateral dimensions of an active region and the strain component for various thickness values of the active region.

FIG. 1b schematically illustrates a graph illustrating the correlation between the corresponding stress and thus strain in the active region measured at a given height, for instance, at approximately 2 nm below the surface of the active region 103A with respect to the length 103L for various initial height values 103H. For example, curve A in FIG. 1b illustrates the corresponding correlation for an initial height 103H of 100 nm. As is evident from FIG. 1b, a significant stress relaxation may be observed at a length 103L of approximately 1 μm and less, thereby indicating that a corresponding strain-inducing mechanism based on an initial height of 100 nm may be less attractive for advanced transistor elements. Curve B illustrates the correlation for an initial height of 30 nm, thereby indicating that a significantly less pronounced stress relaxation may be observed. Similarly, curves C, D and E represent the situation for initial heights of 15, 10 and 5 nm, respectively, wherein a substantially constant stress may be observed for a length of the active region 103A ranging from 2.5-0.5 μm. Consequently, for a low value of the aspect ratio of height 103H and length 103L, the initial strain component may be preserved, thereby providing an efficient strain-inducing mechanism for corresponding transistor elements to be formed in and above the active region 103A having the desired low aspect ratio. Consequently, the height 103H may be adjusted on the basis of initially obtained "raw substrates" in accordance with device and process requirements, at least partially within the substrate 100, so as to provide at least partially a corresponding efficient strain-inducing mechanism, as will be described with reference to FIGS. 1c-1q in more detail.

Figure 1C:
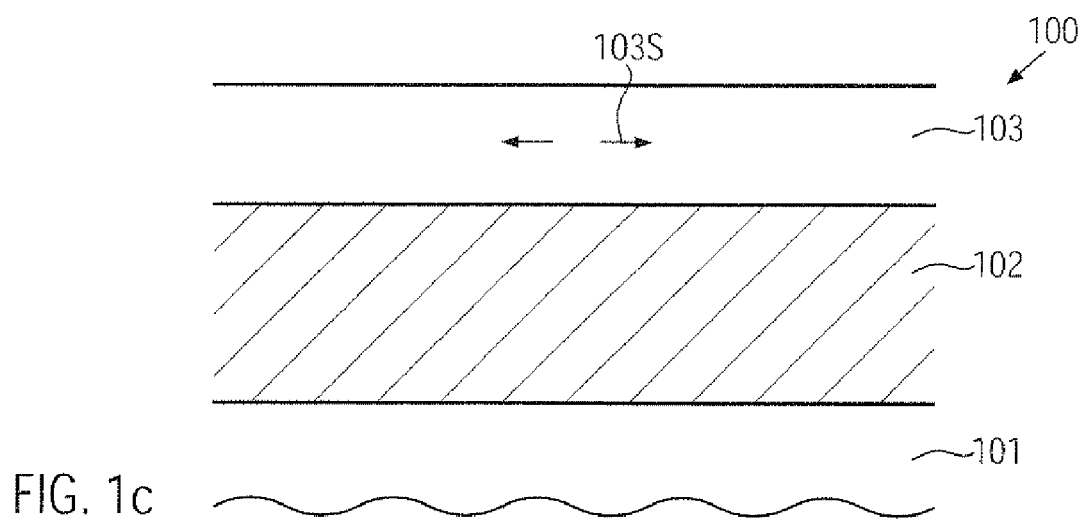
FIGS. 1c-1f schematically illustrate cross-sectional views of a substrate for forming semiconductor devices including a globally strained semiconductor layer, the thickness of which may be reduced in accordance with a specific target height, according to illustrative embodiments.

FIG. 1c schematically illustrates the substrate 100 at an early manufacturing stage in which the semiconductor layer 103 may have its initial thickness of, for instance, 100 nm and more. Furthermore, a certain type and magnitude of strain, as indicated by 103S, may exist in the semiconductor layer 103. For example, the strain component 103S may represent a biaxial tensile strain, which may be accomplished by forming the semiconductor layer 103 on the basis of silicon/germanium alloy, as previously explained. In other cases, the strain 103S may represent a biaxial compressive strain, which may be accomplished by using a buffer layer having a reduced lattice constant compared to the base material of the semiconductor layer 103, such as silicon.

Figure 1D:
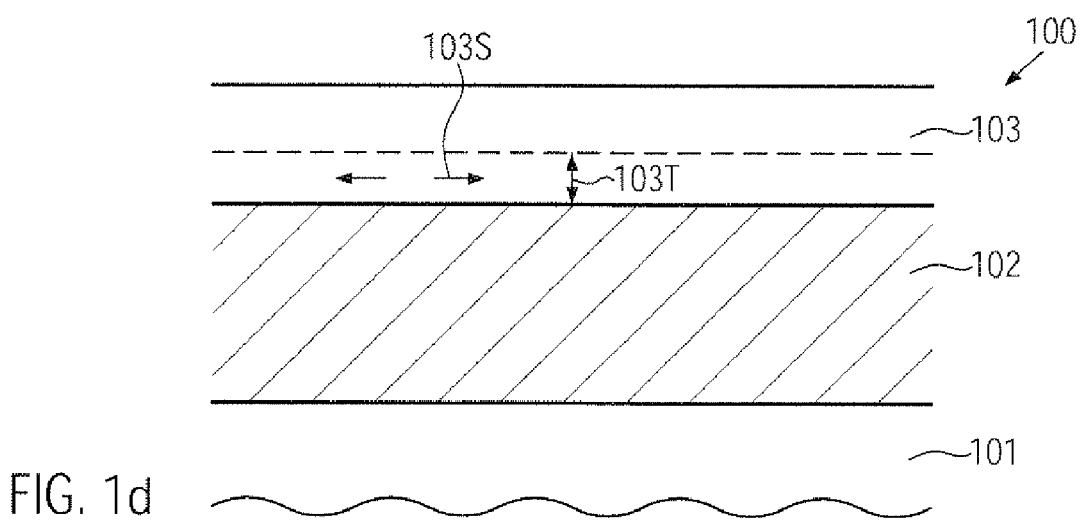

FIG. 1d schematically illustrates the substrate 100 after determining a target height 103T of the semiconductor layer 103 as may be desired for obtaining a specific magnitude of the strain 103S after forming a corresponding isolation structure, such as the structure 104 as shown in FIG. 1a. In the embodiment shown, the corresponding target height 103T may be defined prior to actually patterning the substrate 100, which may be accomplished on the basis of corresponding experiments in which a correlation between stress relaxation and lateral dimensions of active regions may be determined, as is, for instance, described with reference to FIG. 1b. Consequently, the target height 103T may be selected in accordance with the initial thickness of the semiconductor layer 103 and the initial magnitude and type of the strain 103S.

Figure 1E:
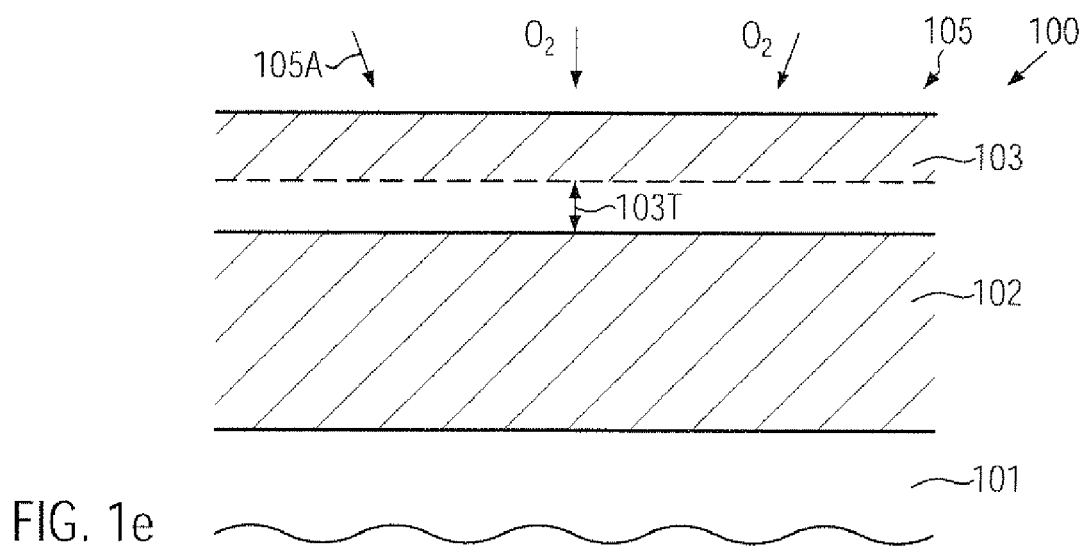

FIG. 1e schematically illustrates the substrate 100 during an initial phase of a process sequence 105 for removing material of the strained semiconductor layer 103 in order to obtain a remaining layer thickness in accordance with the target height 103T. For this purpose, in one illustrative embodiment, the process sequence 105 may comprise a first process 105A in which a material modification may be obtained in order to provide a respective modified layer portion in the semiconductor layer 103 that may extend to a height level substantially determined by the target height 103T. In one illustrative embodiment, the modification process 105A may represent an oxidation process, which may be established in an oxidizing ambient, for instance, by using well-established process recipes for oxidizing a semiconductor material, such as silicon. It should be appreciated that, during the oxidation process 105A, process parameters, such as temperature, oxygen content in the ambient, composition of the initial material of the semiconductor layer 103, the crystalline state thereof and the like, may be adjusted to obtain a desired oxidation rate, which may result in a highly controllable modification process. Since, for a given set of process parameters, the removal rate may be determined with a high degree of accuracy, the desired target height 103T may be obtained with a high degree of process uniformity. In other illustrative embodiments, the process 105A may be performed on the basis of wet chemical techniques, such as wet chemical oxidation, for which self-limiting process recipes may be available, thereby also providing a high degree of process uniformity and thus accuracy in obtaining the desired height level 103T.

Figure 1F:
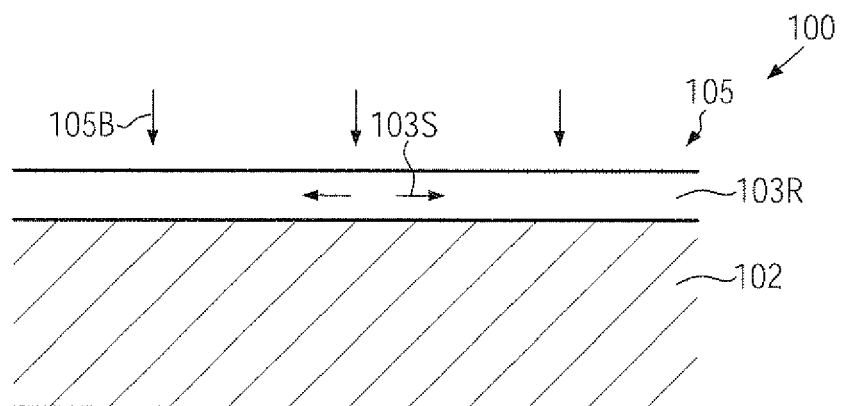

FIG. 1f schematically illustrates the substrate 100 in an advanced phase of the process sequence 105, which, in this phase, may comprise, in one illustrative embodiment, an etch step 105B which may be performed on the basis of well-established selective etch recipes. For example, highly selective wet chemical etch chemistries may be available for silicon dioxide and silicon, which may be used during the process 105B. For instance, hydrofluoric acid may be used to selectively remove silicon dioxide with respect to silicon material. In other cases, the etch process 105B may include a plasma assisted etch process, at least in an initial phase of the etch process 105B, while, at a final phase, a highly selective isotropic etch technique, such as a wet chemical etch technique, may be used. Hence, material of the initial semiconductor layer 103 may be removed, which may experience a significant stress relaxation effect on further processing of the substrate 100 when defining corresponding active regions. On the other hand, the residual layer 103R still has substantially the same initial strain component 103S which may even be preserved during the further processing of the substrate 100 or which may experience a significantly less pronounced stress relaxation, depending on the target height 103T (FIG. 1e) and the characteristics of the active regions to be formed. Consequently, by providing the residual layer 103R, an efficient strain-inducing mechanism may be established, which may be appropriately adapted to process and device specific characteristics of semiconductor devices to be formed on the basis of the substrate 100.

Figure 1G:
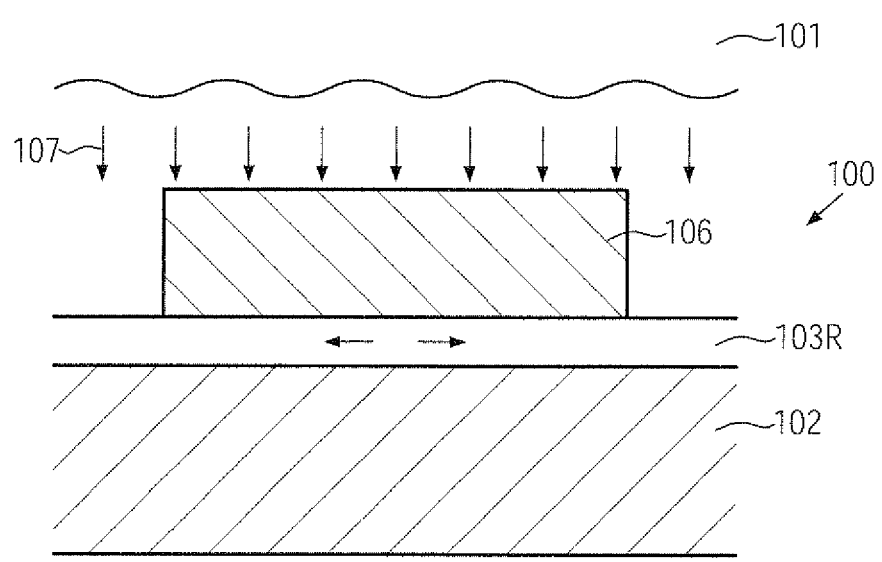
FIGS. 1g-1n schematically illustrate cross-sectional views of a semiconductor device during various manufacturing stages in forming sophisticated SOI transistors, such as fully depleted transistors, on the basis of a globally strained semiconductor layer in an active region, according to further illustrative embodiments.

FIG. 1g schematically illustrates the substrate 100 according to still further illustrative embodiments in which a corresponding adaptation of the height of the semiconductor layer 103R may be obtained after patterning the semiconductor layer 103R. For this purpose, an appropriate etch mask 106 may be formed above the semiconductor layer 103 in order to expose portions of the layer 103R to an etch ambient 107 to form corresponding isolation trenches, which may subsequently be filled with an appropriate dielectric material. The etch mask 106 may be formed on the basis of well-established lithography techniques, while the etch process 107 may be based on respective process parameters and etch chemistries, as are also well established in the art.

Figure 1H:
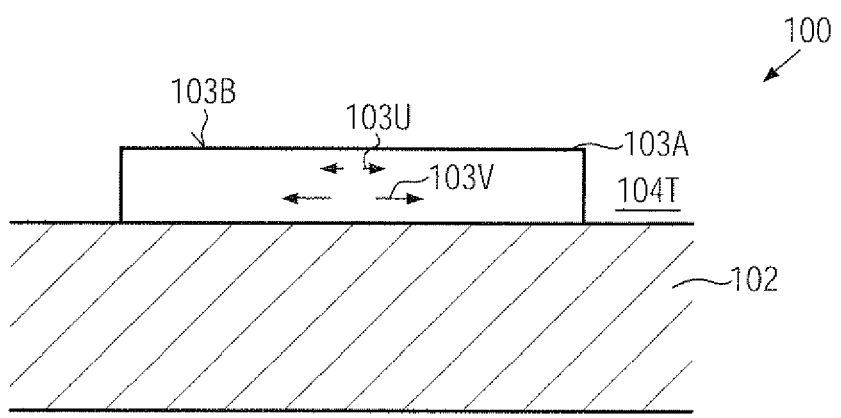

FIG. 1h schematically illustrates the substrate 100 after completing the etch process 107 and after the removal of the etch mask 106. Consequently, the active region 103A may be formed by corresponding isolation trenches 104T, which may extend, in the embodiment shown, down to the buried insulating layer 102. As previously explained, upon forming the isolation trenches 104T, a significant stress relaxation effect may occur which may be specially pronounced at a top surface 103B, thereby resulting in a significantly reduced strain component 103U, whereas, at the bottom of the active region 103A, a moderately high strain component 103V may still be present.

Figure 1I:
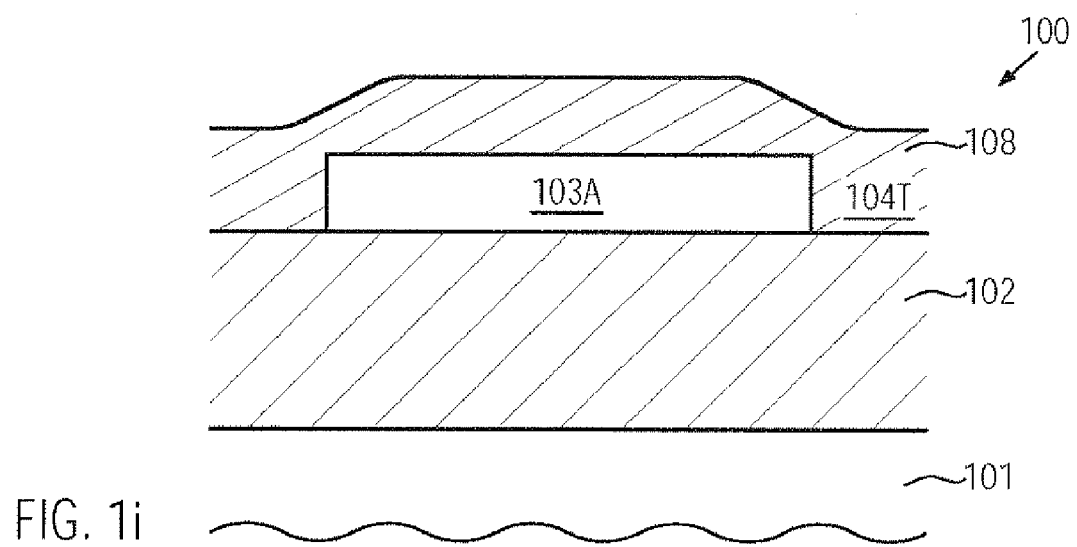

FIG. 1i schematically illustrates the substrate 100 in a further advanced manufacturing stage. As illustrated, a sacrificial fill material 108, for instance in the form of silicon dioxide, silicon nitride and the like, may be provided so as to completely fill the isolation trenches 104T, which may be accomplished on the basis of appropriate deposition techniques, such as thermally or plasma activated chemical vapor deposition (CVD) techniques and the like.

Figure 1J:
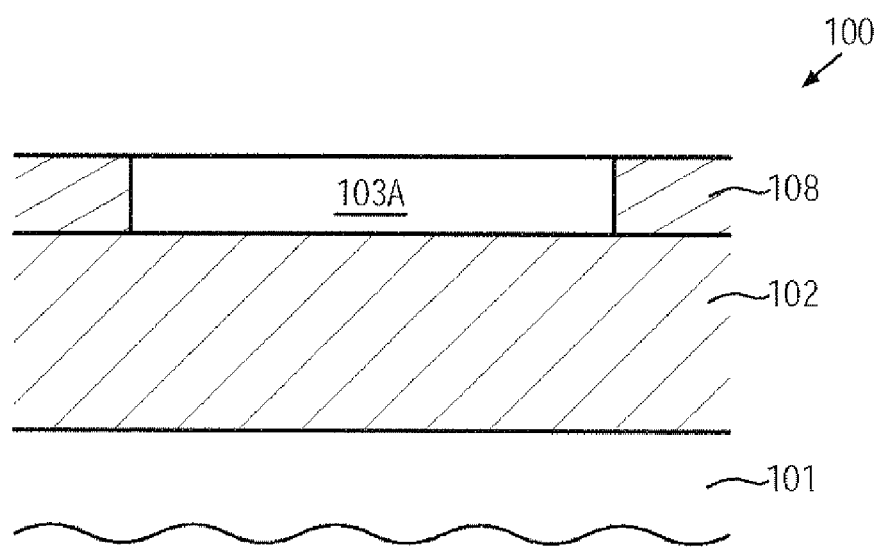

FIG. 1j schematically illustrates the substrate 100 after removing any excess material of the sacrificial fill material 108, which may, for instance, be accomplished by any appropriate planarization technique, such as chemical mechanical polishing (CMP) and the like.

Figure 1K:
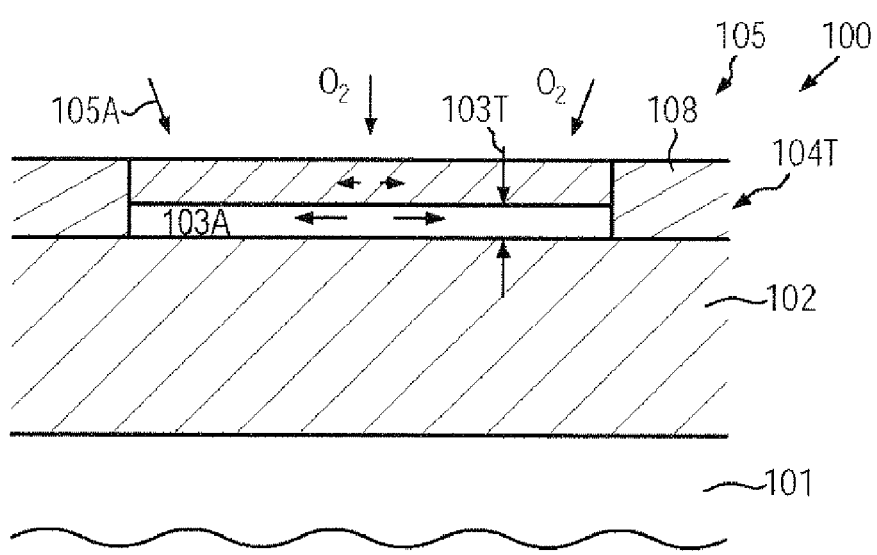

FIG. 1k schematically illustrates the substrate 100 during an initial phase of the process sequence 105 for removing relaxed semiconductor material of the active region 103A to obtain the desired target height 103T. In one illustrative embodiment, the oxidation process 105A may be used on the basis of appropriately selected process parameters, as is also described above. Hence, the exposed portion of the active region 103A may be converted into an oxide material down to a depth level as specified by the target height 103T. On the other hand, the sacrificial fill material 108 may substantially suppress an undesired oxidation at the sidewalls of the active region 103A in order to maintain the desired length of the active region 103A as defined by the isolation trenches 104T. For this purpose, the sacrificial fill material 108 may be provided in the form of a "non-oxidizable" material in the sense that a diffusion of oxygen material into edge areas of the active region 103A may be significantly less compared to the oxygen diffusion through the horizontal portions of the active region 103A. In this sense, the sacrificial material 108 may also represent an oxide material, since also, in this case, oxygen diffusion into the edge areas of the active region 103A may be significantly suppressed compared to the horizontal device portions. If a further enhanced suppression of oxygen diffusion may be desired, the sacrificial fill material 108 may be provided in the form of other components, such as silicon nitride, silicon carbide and the like. Furthermore, in some illustrative embodiments, the oxidation process 105A may be performed on the basis of wet chemical recipes with a substantially self-limiting characteristic, thereby also avoiding undue oxidation at the sidewall portions of the active region 103A, wherein the material composition of the sacrificial fill material 108 may be less critical.

Figure 1L:
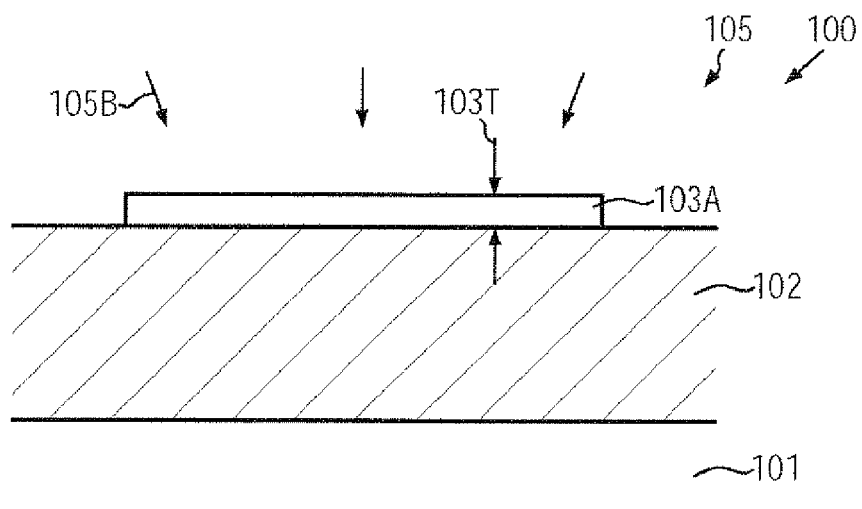

FIG. 1*l* schematically illustrates the substrate 100 during an advanced phase of the process sequence 105, which may, for instance, include the etch process 105B in the form of a selective etch technique, as previously described. In some illustrative embodiments, the sacrificial fill material 108 (FIG. 1*k*) may be removed during the process 105B if the material 108 has similar etch characteristics as the removed portion of the active region 103A. In other illustrative embodiments, the sacrificial fill material 108 may be removed in a separate etch step when a material of different etch behavior is used for the sacrificial fill material 108. For instance, the sacrificial material 108 may be provided in the form of silicon nitride, which may then be selectively removed with respect to silicon and silicon dioxide, for instance on the basis of hot phosphoric acid and the like. In this case, any undue etching into the buried insulating layer 102 and a possible under-etching of the active region 103A may be substantially avoided.

Figure 1M:
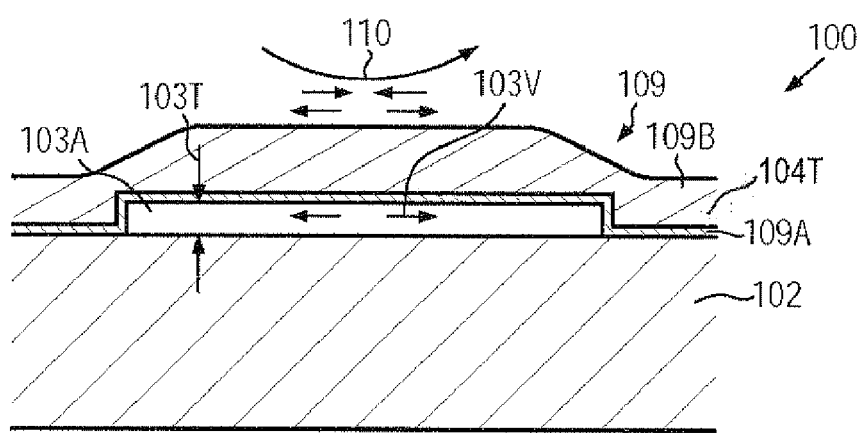

FIG. 1*m* schematically illustrates the substrate 100 in a further advanced manufacturing stage. As illustrated, a fill material 109 may be formed above the active region 103A and within the isolation trenches 104T. In the embodiment shown, the fill material 109 may comprise a first dielectric material 109A, for instance in the form of a silicon nitride material and the like, while a second dielectric layer 109B may be provided to completely fill the isolation trenches 104T, wherein a difference in material composition of the first and second dielectric layers 109A, 109B may provide enhanced controllability during the further processing when removing any excess material of the fill material 109. For example, excess material may be removed on the basis of a CMP process 110, in which the first dielectric layer 109A may act as a CMP stop layer, thereby providing a high degree of uniformity of the CMP process 110. Thereafter, the first dielectric layer 109A may be removed from above the active region 103A by a further CMP process, an etch process and the like, depending on the overall process requirements. It should be appreciated that the fill material 109, or at least a portion thereof, such as the second dielectric layer 109B, may be provided so as to exhibit a desired internal stress level, thereby appropriately compensating for a reduced strain component, which may typically be observed at the edges of the active region 103A. For example, a plurality of dielectric materials may be deposited with a desired magnitude and type of internal stress by appropriately selecting the corresponding deposition parameters. As an example, silicon nitride may be deposited on the basis of well-established plasma enhanced CVD techniques to exhibit a high internal compressive or tensile stress level, which may amount to two GPa and higher, depending on the type of internal stress. For instance, if the active region 103A may comprise an internal biaxial tensile strain component, a corresponding substantially uniaxial compressive or tensile strain may be superimposed by providing a corresponding internal stress level for the fill material 109. That is, by providing an internal compressive stress level, a corresponding increased tensile strain component may be obtained along the length of the active region 103A. On the other hand, if a corresponding tensile stress component may be used for the fill material 109, a corresponding compressive strain component may be induced in the active region 103A.

Consequently, after removing excess material of the fill material 109, corresponding isolation structures may be formed, such as the isolation structures 104 as shown in FIG. 1*a*, wherein, however, the isolation structures may enclose the active region 103A having the desired target height 103T and thus a moderately high remaining strain component 103V.

Figure 1N:
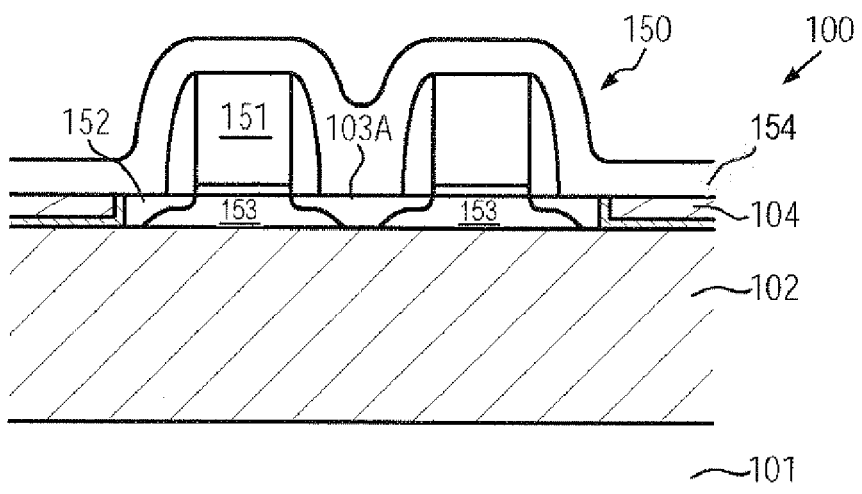

FIG. 1*n* schematically illustrates the substrate 100 in a further advanced manufacturing stage in which one or more transistor elements 150 may be formed in and above the active region 103A as a part of a semiconductor device, such as a complex integrated circuit in the form of a CPU, a memory circuit, an application specific integrated circuit and the like. For instance, the transistors 150 may comprise a gate electrode structure 151 formed above a channel region 153, which may be laterally enclosed by drain and source regions 152. Due to the remaining strain component 103*v* (FIG. 1*m*), the channel regions 153 may have an increased charge carrier mobility, thereby enhancing overall performance of the transistors 150, as also previously discussed. Furthermore, the active region 103A may be enclosed by the trench isolation structure 104, as previously discussed. Furthermore, in some illustrative embodiments, one or more further strain-inducing mechanisms may be provided, for instance in the form of a local strain-inducing mechanism, as previously explained. For example, a highly stressed dielectric overlayer 154, for instance in the form of silicon nitride and the like, may be provided above the transistors 150 wherein the internal stress level may further contribute to an enhanced overall strain component in the channel region 153. In other illustrative embodiments, alternatively or additionally, further strain-inducing mechanisms may be provided, such as a semiconductor alloy embedded in a portion of the active region 103A adjacent to the channel region 153, for instance in the form of a silicon/germanium alloy, a silicon/carbon alloy and the like, in order to further induce a corresponding strain, as previously explained.

The transistors 150 may be formed on the basis of the substrate 100 in accordance with well-established process techniques, wherein, however, the reduced target height 103T (FIG. 1*m*) may be taken into consideration, for instance, with respect to establishing a desired dopant profile for the drain and source regions 152. As previously explained, the transistors 150 may represent, due to the reduced height of the active region 103A, fully depleted field effect transistors which may be advantageous in performance driven integrated circuits with respect to switching speed and the like. Consequently, the strain-inducing mechanism provided by the remaining strain component 103V (FIG. 1*m*) may be advantageously used for sophisticated SOI architectures, while at the same time providing enhanced flexibility in adapting the strain-inducing mechanism to the corresponding device and process requirements, for instance, by appropriately selecting the target height 103T so as to maintain a moderately high strain component and also be compatible with requirements for fully depleted transistor elements.

Figure 1O:
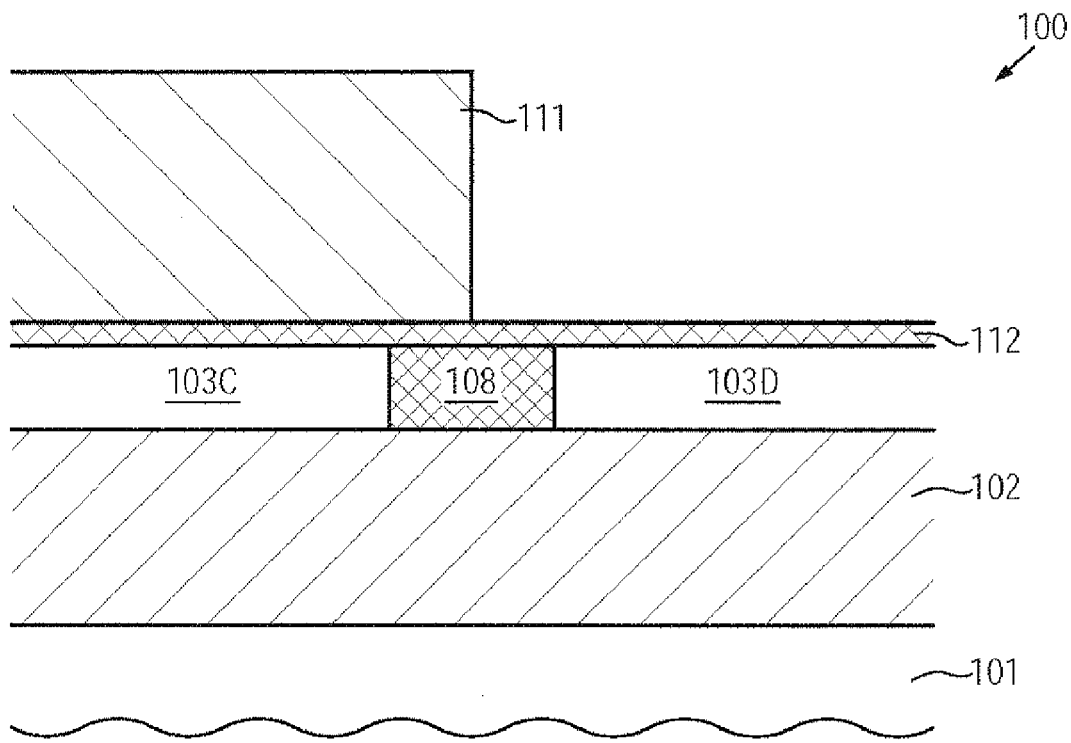
FIGS. 1o-1q schematically illustrate cross-sectional views of a semiconductor device during various manufacturing stages in forming active regions with different height and thus strain levels after providing respective isolation trenches, according to still further illustrative embodiments.

FIG. 1*o* schematically illustrates the substrate 100 according to further illustrative embodiments in which a material removal of an active region may be performed in a locally selective manner. As illustrated, the substrate may comprise the isolation trench 104T filled with an appropriate fill material 108. In the embodiment shown, the isolation trench 104T may separate active regions 103C, 103D which may receive a different target height. In the example shown, it may be assumed that the active region 103C may be maintained at the initial thickness, while the active region 103D may be reduced in thickness in accordance with a specific target height. For this purpose, a cap layer 112 may be formed above the active regions 103C and 103D while an etch mask 111 may cover the active region 103C. The cap layer 112 and the etch mask 111 may be formed on the basis of well-established process techniques including the deposition of an appropriate material, such as silicon nitride, silicon dioxide and the like, followed by a lithography process for providing the etch mask 111, for instance in the form of a resist material and the like. Based on the etch mask 111, an exposed portion of the cap layer 112 may be removed, for instance, by respective selective etch techniques for which a plurality of known recipes are available for a plurality of dielectric materials.

Figure 1P:
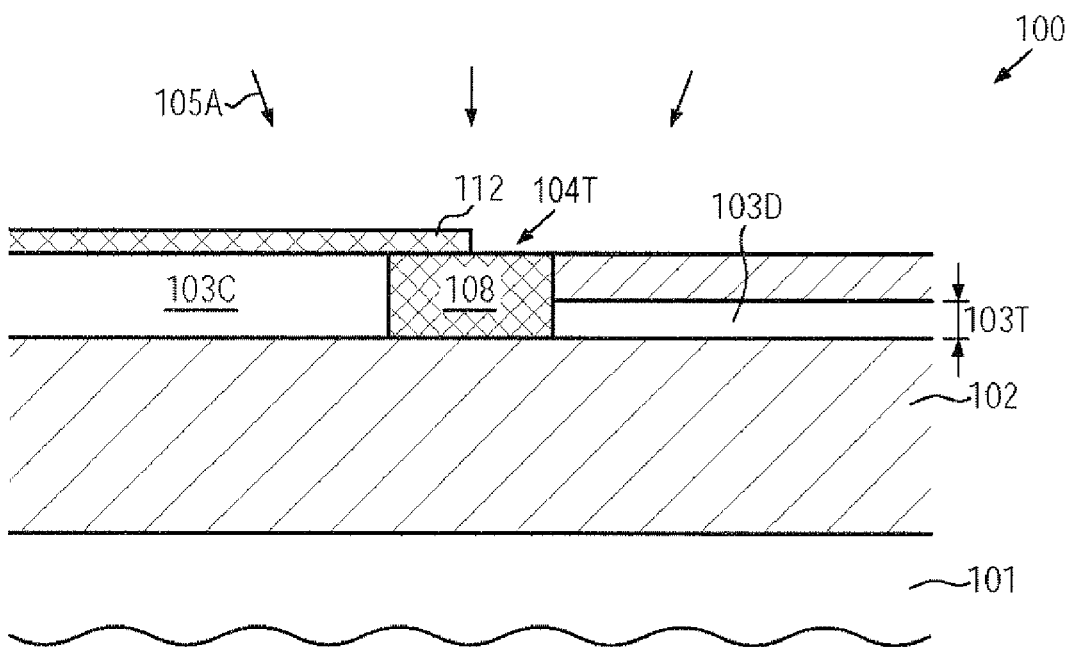

FIG. 1p schematically illustrates the substrate 100 after the above-described process sequence and after the removal of the etch mask 111. Furthermore, the substrate 100 may be exposed to the oxidation process 105A, thereby forming an oxidized material in the exposed active region 103D, while the sacrificial material 108 and the cap layer 112 may prevent an oxidation of the active region 103C. Thus, relaxed material of the active region 103D may be removed down to the specified target height 103T.

Figure 1Q:
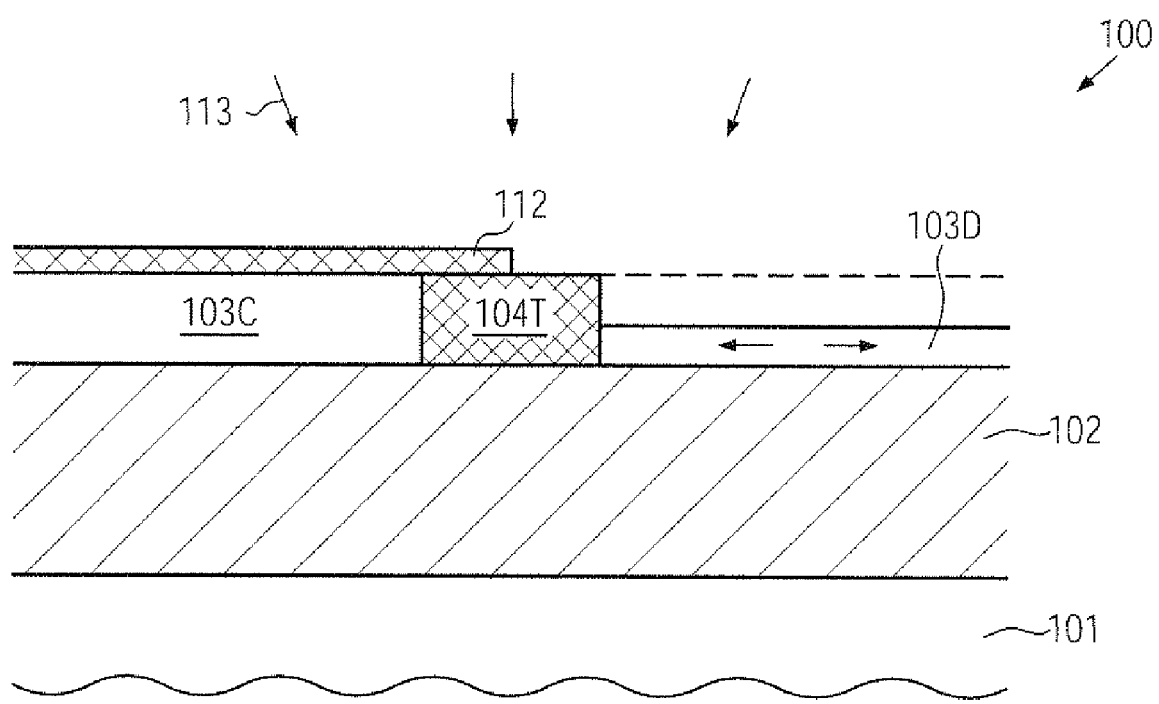

FIG. 1q schematically illustrates the substrate 100 in a further advanced manufacturing stage. As illustrated, the oxidized portion of the active region 103D may be removed and also the fill material 108 and the cap layer 112 may be removed, which may be accomplished on the basis of well-established etch recipes, depending on the material composition of the various components. For example, the sacrificial fill material 108 may be provided in the form of silicon nitride material and also the cap layer 112 may be provided as a silicon nitride material. Thus, the oxidized portion of the active region 103D may be removed on the basis of well-established wet chemical etch chemistries, as is also previously described. Thereafter, a selective epitaxial growth process 113 may be performed in order to increase the layer thickness in the active region 103D, while substantially maintaining the strain component prevailing in the active region 103D during the selective epitaxial growth process. The cap layer 112 may act as a growth mask, thereby maintaining the status of the active region 103C. Thereafter, the cap layer 112 may be removed which may be accomplished on the basis of any appropriate selective etch technique, thereby providing the active regions 103C and 103D with substantially the same height, while nevertheless a different strain status may be obtained. Thus, transistor elements requiring a reduced strain component may be formed in and above the active region 103C, while performance driven transistor elements may be formed in and above the active region 103D. In this case, an increased degree of design flexibility may be achieved due to the "decoupling" of the increased strain component in the active region 103D from the corresponding height of the active regions 103D, 103C.

As a result, the present disclosure provides techniques for forming substrates and corresponding semiconductor devices in which a significant portion of an initial strain component of a globally strained semiconductor material may be maintained by appropriately reducing a height of the active region, at least temporarily, thereby providing an additional efficient strain-inducing mechanism, which may be combined with additional local strain-inducing mechanisms. In some illustrative embodiments, the reduction in height of the active region may be accomplished after forming respective isolation trenches, wherein the process of removing the strain relaxed material may be efficiently implemented into the process sequence for forming trench isolation structures, thereby not unduly contributing to overall process complexity. In some illustrative embodiments, the reduced height of the active regions may be used for forming fully depleted transistor elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
providing a silicon-containing semiconductor layer above a substrate, said silicon-containing semiconductor layer having an internal biaxial strain;
forming isolation trenches in said silicon-containing semiconductor layer;
reducing a thickness of said silicon-containing semiconductor layer;
filling said isolation trenches with a sacrificial material prior to reducing a thickness of said silicon-containing semiconductor layer; and
filling said isolation trenches with an insulating material.

2. The method of claim 1, wherein a thickness of said silicon-containing semiconductor layer is reduced after forming said isolation trenches.

3. The method of claim 1, wherein filling said isolation trenches with an insulating material comprises depositing a first dielectric layer and a second dielectric layer on said first dielectric layer and removing said second dielectric layer from above said first dielectric layer by performing a planarization process.

4. The method of claim 1, wherein said isolation trenches are formed so as to extend to a buried insulating layer.

5. The method of claim 1, wherein reducing a thickness of said silicon-containing semiconductor layer comprises oxidizing a portion of said silicon-containing semiconductor layer in the presence of said sacrificial material and removing said oxidized portion.

6. The method of claim 5, wherein said oxidized portion is removed by performing a selective etch process.

7. The method of claim 1, further comprising forming one or more transistor elements in and above an active region defined by said isolation trenches.

8. The method of claim 7 wherein said isolation trenches are filled so as to induce a strain component in said active region.

9. The method of claim 7, further comprising providing at least one further strain-inducing mechanism when forming said one or more transistors so as to locally modify a strain in said active region.

10. The method of claim 9, wherein providing at least one further strain-inducing mechanism comprises forming a strain-inducing dielectric layer above said one or more transistors.

11. A method, comprising:
defining an active region in a strained silicon-containing layer by forming an isolation trench in said strained silicon-containing layer;

removing portions of said active region that have a reduced strain after forming said isolation trench by oxidizing a portion of said active region and removing said oxidized portion; and forming a transistor in and above said active region.

12. The method of claim 11, further comprising filling said isolation trench with a sacrificial material prior to oxidizing said portion of the active region.

13. The method of claim 12, further comprising removing at least a part of said sacrificial material when removing said oxidized portion.

14. The method of claim 11, further comprising filling said isolation trench with an insulating material after removing material of reduced strain of said active region.

15. The method of claim 14, wherein said isolation trench is filled so as to induce a strain component in said active region.

16. The method of claim 14, wherein filling said isolation trench with an insulating material comprises depositing a first dielectric layer and a second dielectric layer, wherein said second dielectric layer completely fills said isolation trench.

17. The method of claim 16, further comprising removing excess material of said second dielectric layer by performing a chemical mechanical planarization process using said first dielectric layer as a stop layer.

18. A method of forming a substrate for strained transistor devices, the method comprising:

providing a substrate comprising a semiconductor layer having a biaxial strain, said semiconductor layer having an initial thickness; and reducing said initial thickness at least in a portion of said semiconductor layer so as to adjust a strain level with respect to a strain relaxing effect caused when said semiconductor layer is processed so as to form trench isolation structures for providing a plurality of active regions, wherein reducing said initial thickness comprises oxidizing at least said portion of said semiconductor layer and removing said oxidized portions of said semiconductor layer.

19. The method of claim 18, further comprising patterning said semiconductor layer so as to form an isolation trench for said trench isolation structure, wherein said semiconductor layer is patterned prior to reducing said initial thickness.

20. The method of claim 18, wherein said initial thickness is reduced prior to processing said semiconductor layer.

21. The method of claim 18, wherein reducing said initial thickness of at least a portion of said semiconductor layer comprises selectively reducing said initial thickness in a first portion while substantially maintaining said initial thickness in a second portion of said semiconductor layer.

22. The method of claim 18, wherein said biaxial strain is a tensile strain.

23. The method of claim 18, wherein said semiconductor layer is provided on an insulating material.

24. A method, comprising:

defining an active region in a strained silicon-containing layer by forming an isolation trench in said strained silicon-containing layer;

removing portions of said active region that have a reduced strain after forming said isolation trench;

forming a transistor in and above said active region;

filling said isolation trench with an insulating material after removing material of reduced strain of said active region, wherein filling said isolation trench with an insulating material comprises depositing a first dielectric layer and a second dielectric layer, wherein said second dielectric layer completely fills said isolation trench; and removing excess material of said second dielectric layer by performing a chemical mechanical planarization process using said first dielectric layer as a stop layer.

* * * * *